United States Patent
Kosai et al.

(10) Patent No.: US 12,532,693 B2
(45) Date of Patent: Jan. 20, 2026

(54) SUBSTRATE PROCESSING APPARATUS AND SUBSTRATE PROCESSING METHOD

(71) Applicant: Tokyo Electron Limited, Tokyo (JP)

(72) Inventors: Kazuki Kosai, Kumamoto (JP); Kazuyoshi Shinohara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 149 days.

(21) Appl. No.: 17/801,911

(22) PCT Filed: Feb. 15, 2021

(86) PCT No.: PCT/JP2021/005413
§ 371 (c)(1),
(2) Date: Aug. 24, 2022

(87) PCT Pub. No.: WO2021/172064
PCT Pub. Date: Sep. 2, 2021

(65) Prior Publication Data
US 2023/0079190 A1    Mar. 16, 2023

(30) Foreign Application Priority Data
Feb. 25, 2020 (JP) .................................. 2020-029483

(51) Int. Cl.
*H01L 21/67* (2006.01)
*B08B 3/02* (2006.01)
(Continued)

(52) U.S. Cl.
CPC ........ *H01L 21/67051* (2013.01); *B08B 3/022* (2013.01); *B08B 13/00* (2013.01);
(Continued)

(58) Field of Classification Search
None
See application file for complete search history.

(56) References Cited

U.S. PATENT DOCUMENTS

2009/0229641 A1*  9/2009  Yoshida ................... B08B 3/14
                                                     134/107
2010/0136795 A1*  6/2010  Honma ............. H01L 21/68707
                                                     438/758
(Continued)

FOREIGN PATENT DOCUMENTS

JP   H08-064568 A   3/1996
JP   2005-217226 A  8/2005
(Continued)

OTHER PUBLICATIONS

Merriam-Webster dictionary definition of "while".*
International Search Report issued on May 11, 2021 for WO 2021/172064 A1 (6 pages).

*Primary Examiner* — Kaj K Olsen
*Assistant Examiner* — Ryan L Coleman
(74) *Attorney, Agent, or Firm* — Venjuris, P.C.

(57) ABSTRACT

A substrate processing apparatus includes a holding unit, a liquid supply unit, a collection unit, a circulation path, a gas supply unit, and a control unit. The holding unit holds a substrate. The liquid supply unit supplies a processing liquid to a first main surface of the substrate held by the holding unit. The collection unit collects the processing liquid used for processing the substrate. The circulation path returns the processing liquid collected by the collection unit back to the liquid supply unit. The gas supply unit supplies a gas to a second main surface to the substrate held by the holding unit in a direction opposite to the first main surface. The control unit supplies the gas to the second main surface when supplying the processing liquid to be returned to the liquid supply unit by the circulation path to the first main surface.

12 Claims, 14 Drawing Sheets

(51) Int. Cl.
*B08B 13/00* (2006.01)
*H01L 21/02* (2006.01)
*H01L 21/66* (2006.01)
*H01L 21/687* (2006.01)

(52) U.S. Cl.
CPC .. *H01L 21/02057* (2013.01); *H01L 21/67248* (2013.01); *H01L 21/68764* (2013.01); *H01L 22/20* (2013.01)

(56) References Cited

U.S. PATENT DOCUMENTS

| 2014/0116480 | A1* | 5/2014 | Higashijima | ..... | H01L 21/67051 |
| | | | | | 134/153 |
| 2015/0107622 | A1* | 4/2015 | Takaki | .............. | H01L 21/67017 |
| | | | | | 134/198 |
| 2018/0090306 | A1* | 3/2018 | Higashijima | ..... | H01L 21/67051 |

FOREIGN PATENT DOCUMENTS

| JP | 2007-335826 A | 12/2007 |
| JP | 2010-186859 A | 8/2010 |
| JP | 2015-115409 A | 6/2015 |
| JP | 2018-056293 A | 4/2018 |
| KR | 10-2019-00958887 A | 8/2019 |

* cited by examiner

FIG. 2

| STEP | | S101 | S102 | S103 | S104 | S105 | S106 |
|---|---|---|---|---|---|---|---|
| FIGURES | | FIG. 3 | FIG. 4 | FIG. 5 | FIG. 4 | FIG. 6 | FIG. 7 |
| FIRST MAIN SURFACE | FIRST PROCESSING LIQUID | FIRST CHEMICAL LIQUID | RINSING LIQUID | SECOND CHEMICAL LIQUID | RINSING LIQUID | DRYING LIQUID | — |
| SECOND MAIN SURFACE | SECOND PROCESSING LIQUID | — | RINSING LIQUID | SECOND CHEMICAL LIQUID | RINSING LIQUID | RINSING LIQUID | — |
| | N₂ GAS [L/min] | Q1 | Q2 (<Q1) | Q2 | Q2 | Q2 | Q2 |

SUBSTRATE PROCESSING APPARATUS AND SUBSTRATE PROCESSING METHOD

CROSS REFERENCE TO RELATED APPLICATIONS

This application is a national phase of PCT application No. PCT/JP2021/005413, filed on 15 Feb. 2021, which claims priority from Japanese patent application No. 2020-029483, filed on 25 Feb. 2020, all of which are incorporated herein by reference.

TECHNICAL FIELD

The present disclosure relates to a substrate processing apparatus and a substrate processing method.

BACKGROUND

A liquid processing apparatus described in Patent Document 1 includes a nozzle member. The nozzle member is provided below a substrate in a non-rotating state.

The nozzle member includes a processing liquid discharge nozzle for discharging a processing liquid and a gas discharge nozzle for discharging a dry gas on the upper surface thereof. The processing liquid discharge nozzle supplies a chemical liquid and a rinsing liquid to the lower surface of the substrate in this order. Thereafter, in a state where the processing liquid discharge nozzle discharges the rinsing liquid, the gas discharge nozzle discharges the dry gas to form a mist of the rinsing liquid.

PRIOR ART DOCUMENT

Patent Document

Patent Document 1: Japanese Patent Laid-Open Publication No. 2010-186859

SUMMARY OF THE INVENTION

Problems to be Solved

An aspect of the present disclosure provides a technique for suppressing the generation of particles on a second main surface opposite to a first main surface when supplying a processing liquid to be reused to the first main surface of a substrate, and suppressing fluctuations in the concentration of the processing liquid.

Means to Solve the Problems

According to an aspect of the present disclosure, a substrate processing apparatus includes a holding unit, a liquid supply unit, a collection unit, a circulation path, a gas supply unit, and a control unit. The holding unit holds a substrate. The liquid supply unit supplies a processing liquid to a first main surface of the substrate held by the holding unit. The collection unit collects the processing liquid used for processing the substrate. The circulation path returns the processing liquid collected by the collection unit to the liquid supply unit. The gas supply unit supplies a gas to a second main surface of the substrate held by the holding unit in a direction opposite to the first main surface. The control unit controls the liquid supply unit and the gas supply unit. The control unit supplies the gas to the second main surface when supplying the processing liquid to be returned to the liquid supply unit by the circulation path to the first main surface.

Effect of the Invention

According to an aspect of the present disclosure, it is possible to suppress the generation of particles on a second main surface opposite to a first main surface when supplying a processing liquid to be reused to the first main surface of a substrate, and suppress fluctuations in the concentration of the processing liquid.

BRIEF DESCRIPTION OF THE DRAWINGS

FIG. 2 is a table illustrating a substrate processing method according to the embodiment.

DETAILED DESCRIPTION TO EXECUTE THE INVENTION

Figure 1:
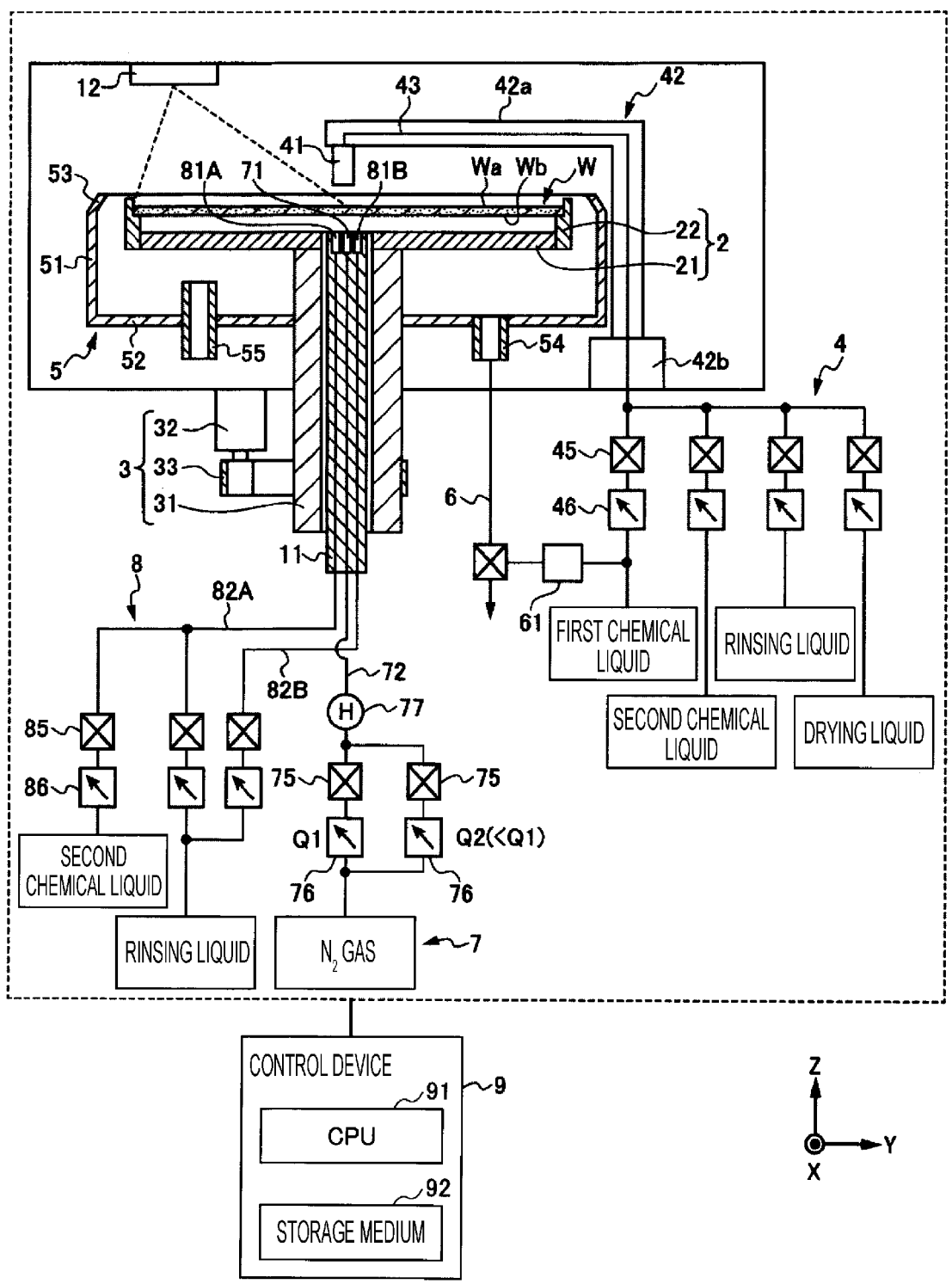
FIG. 1 is a diagram illustrating a substrate processing apparatus according to an embodiment.

Hereinafter, embodiments of the present disclosure will be described with reference to the accompanying drawings. In each drawing, the same or corresponding components may be designated by the same reference numerals and descriptions thereof may be omitted.

A substrate processing method includes, for example, forming a liquid film of a chemical liquid on a first main surface (e.g., an upper surface) of a substrate, replacing the liquid film of the chemical liquid with a liquid film of a rinsing liquid, replacing the liquid film of the rinsing liquid with a liquid film of a drying liquid, and exposing the first main surface from the liquid film of the drying liquid. The processes are performed in the same processing container. The chemical liquid, rinsing liquid, and drying liquid are collectively referred to as a processing liquid.

The chemical liquid is supplied to the center of the first main surface of a rotating substrate and spreads in the entire radial direction of the first main surface by centrifugal force to form a liquid film. For example, buffered hydrofluoric acid (BHF) is used as the chemical liquid. A plurality of types of chemical liquids may be supplied in order, and in that case, the formation of the liquid film of a rinsing liquid is also performed between the formation of the liquid film of a first chemical liquid and the formation of the liquid film of a second chemical liquid.

The rinsing liquid is supplied to the center of the first main surface of the rotating substrate and spreads over the entire radial direction of the first main surface by centrifugal force, whereby the chemical liquid contained in the liquid film is replaced with the rinsing liquid. The rinsing liquid washes away the chemical liquid remaining on the first main surface. Pure water such as deionized water (DIW) is used as the rinsing liquid.

The drying liquid is supplied to the center of the first main surface of the rotating substrate and spreads over the entire radial direction of the first main surface by centrifugal force, whereby the rinsing liquid contained in the liquid film is replaced with the drying liquid. A liquid having a lower surface tension than the rinsing liquid is used as the drying liquid. It is possible to suppress the collapse of the uneven pattern due to surface tension. The drying liquid is, for example, isopropyl alcohol (IPA).

After forming the liquid film of the drying liquid, the first main surface of the substrate is exposed from the liquid film of the drying liquid. The drying liquid is shaken off from the first main surface by the rotation of the substrate. At that time, the supply position of the drying liquid may be moved from the center of the first main surface toward the peripheral edge. By moving the supply position of the drying liquid, an opening is formed in the center of the liquid film of the drying liquid, and the opening gradually expands from the central position to the peripheral edge position. A dry gas such as nitrogen gas may be supplied toward an opening edge in order to hold down the opening edge of the liquid film of the drying liquid. The supply position of the dry gas moves following the supply position of the drying liquid.

When the chemical liquid is supplied, the liquid film of the chemical liquid vaporizes and vapor of the chemical liquid is generated. When the vapor of the chemical liquid wraps around from the first main surface of the substrate to a second main surface (e.g., a lower surface) opposite to the first main surface, particles are generated on the second main surface. Particles are mainly generated on the peripheral edge portion of the second main surface. In the present specification, the peripheral edge portion is, for example, a portion within 50 mm from the peripheral edge.

In order to suppress the generation of particles, it is effective to supply the rinsing liquid to the second main surface of the substrate when the chemical liquid is supplied to the first main surface of the substrate. However, since the chemical liquid and the rinsing liquid are supplied to the substrate at the same time, the chemical liquid after the process mixes with the rinsing liquid and the concentration of the chemical liquid changes. When the concentration of the chemical liquid changes, the performance of the chemical liquid, for example, the etching rate changes. As a result, it becomes difficult to reuse the chemical liquid.

Therefore, in the present embodiment, when the chemical liquid to be reused is supplied to the first main surface of the substrate, the gas is supplied to the second main surface of the substrate. The supplied gas spreads along the second main surface of the substrate and suppresses the vapor of the chemical liquid from wrapping around the second main surface. Therefore, it is possible to suppress the generation of particles on the second main surface. Further, since the chemical liquid and the gas are supplied to the substrate at the same time, the fluctuation of the concentration of the chemical liquid may be suppressed as compared with the case where the chemical liquid and the rinsing liquid are supplied to the substrate at the same time. The chemical liquid and the gas are hardly mixed with each other.

Examples of the chemical liquid to be reused include BHF. BHF is used for etching an oxide film. Since BHF is expensive, it may be reused to reduce the cost. In addition to cost reduction, it is also possible to reduce waste liquid. The chemical liquid to be reused is not limited to BHF, and may be dilute hydrofluoric acid (DHF) or diluted sulfuric peroxide (DSP).

Next, the substrate processing apparatus 1 of the present embodiment will be described with reference to FIG. 1. In FIG. 1, the X-axis direction, the Y-axis direction, and the Z-axis direction are perpendicular to each other. The X-axis direction and the Y-axis direction are the horizontal directions, and the Z-axis direction is the vertical direction.

The substrate processing apparatus 1 processes the substrate W. The substrate W includes, for example, a silicon wafer or a compound semiconductor wafer. The substrate W may be a glass substrate. The substrate processing apparatus 1 includes, for example, a holding unit 2, a rotation mechanism 3, a first liquid supply unit 4, a collection unit 5, a circulation path 6, a gas supply unit 7, a second liquid supply unit 8, and a control unit 9.

The holding unit 2 holds the substrate W. The substrate W includes a first main surface Wa and a second main surface Wb opposite to the first main surface Wa. The holding unit 2 holds the substrate W horizontally, for example, with the first main surface Wa of the substrate W facing upward. The holding unit 2 includes a base plate 21 that forms a space from the second main surface Wb of the substrate W and an opening/closing claw 22 that grips the peripheral edge of the substrate W. The base plate 21 has a disk shape and is disposed horizontally. A hole is formed in the center of the base plate 21, and a fluid supply shaft 11 is disposed in the hole. A plurality of opening/closing claws 22 is disposed at intervals along the peripheral edge of the base plate 21.

The rotation mechanism 3 rotates the holding unit 2. The rotation mechanism 3 includes, for example, a rotation shaft 31 extending downward from the central portion of the base plate 21 of the holding unit 2, a rotation motor 32 for rotating the rotation shaft 31, and a belt 33 for transmitting a rotation driving force of the rotation motor 32 to the rotation shaft 31. The rotation shaft 31 has a cylindrical shape, and the fluid supply shaft 11 is disposed inside the rotation shaft 31. The fluid supply shaft 11 does not rotate together with the rotation shaft 31.

The first liquid supply unit 4 supplies a first processing liquid to the first main surface Wa of the substrate W held by the holding unit 2. The first liquid supply unit 4 includes, for example, a nozzle 41 for discharging the first processing liquid, a moving mechanism 42 for moving the nozzle 41 in the radial direction of the substrate W, and a supply line 43 for supplying the first processing liquid to the nozzle 41. The nozzle 41 is provided above the holding unit 2 and includes a discharge port for discharging the first processing liquid downward.

The moving mechanism 42 includes, for example, a swivel arm 42a for holding the nozzle 41 and a swivel mechanism 42b for swiveling the swivel arm 42a. The swivel mechanism 42b may also serve as a mechanism for raising and lowering the swivel arm 42a. The swivel arm 42a is disposed horizontally, holds the nozzle 41 at one end in the longitudinal direction thereof, and is swiveled around a swivel shaft extending downward from the other end in the longitudinal direction thereof. The moving mechanism 42 may include a guide rail and a linear motion mechanism instead of the swivel arm 42a and the swivel mechanism 42b. The guide rails are disposed horizontally, and the linear motion mechanism moves the nozzle 41 along the guide rails.

In the middle of the supply line 43, an on-off valve 45 for opening and closing the flow path of the first processing liquid, and a flow rate controller 46 for controlling the flow rate of the first processing liquid are provided. The on-off valve 45 and the flow rate controller 46 are provided for each type of the first processing liquid.

The first processing liquid is supplied to the first main surface Wa of the substrate W. As the first processing liquid, for example, a first chemical liquid, a second chemical liquid, a rinsing liquid, and a drying liquid are used. The first chemical liquid is BHF, and the second chemical liquid is a mixture of hydrogen peroxide and ammonium hydroxide (SC1).

The type of the first processing liquid is not particularly limited. Further, although the plurality of types of first processing liquids are discharged from one nozzle 41 in FIG. 1, the processing liquids may be discharged from different nozzles 41. When the number of nozzles 41 is plural, a plurality of moving mechanisms 42 may be provided so that the plurality of nozzles 41 may be individually moved.

The collection unit 5 collects the first processing liquid used for processing the substrate W. The collection unit 5 also collects a second processing liquid (to be described later). The collection unit 5 includes, for example, a cylindrical portion 51 serving as a cup, a bottom cover portion 52, and an inclined portion 53. The cylindrical portion 51 has an inner diameter larger than the diameter of the substrate W and is disposed vertically. The bottom cover portion 52 closes the opening at the lower end of the cylindrical portion 51. The inclined portion 53 is formed over the entire circumference of the upper end of the cylindrical portion 51, and is inclined upward toward the radial inward side of the cylindrical portion 51. The bottom cover portion 52 is provided with an exhaust pipe 54 for discharging the first processing liquid accumulated inside the cup, and an exhaust pipe 55 for discharging the gas accumulated inside the cup.

The circulation path 6 returns the first processing liquid collected by the collection unit 5 to the first liquid supply unit 4. The first liquid supply unit 4 supplies the first processing liquid returned to the first liquid supply unit 4 by the circulation path 6 to the first main surface Wa of another substrate W, and reuses the first processing liquid for processing the substrate W. The first processing liquid to be reused is, for example, a first chemical liquid. After being collected by the collection unit 5, the second chemical liquid, the rinsing liquid, and the drying liquid are discarded without being returned to the first liquid supply unit 4, and are not reused. The circulation path 6 includes a buffer tank 61 in the middle thereof. The buffer tank 61 stores, for example, a used first chemical liquid.

The gas supply unit 7 supplies a gas to the second main surface Wb of the substrate W held by the holding unit 2. An inert gas such as $N_2$ gas is used as the gas. The gas supply unit 7 includes, for example, a nozzle 71 for discharging $N_2$ gas and a supply line 72 for supplying $N_2$ gas to the nozzle 71. The nozzle 71 is provided, for example, at the upper end of the fluid supply shaft 11 and includes a discharge port for discharging $N_2$ gas upward. The discharge port may discharge $N_2$ gas diagonally upward toward the center of the second main surface Wb of the substrate W.

In the middle of the supply line 72, an on-off valve 75 that opens and closes the flow path of the $N_2$ gas, and a flow rate controller 76 that controls the flow rate of the $N_2$ gas are provided. A plurality of on-off valves 75 and a plurality of flow rate controllers 76 may be provided for switching the flow rate of the $N_2$ gas. A set of on-off valve 75 and flow rate controller 76 supplies the $N_2$ gas of the flow rate Q1 to the nozzle 71. The other set of on-off valve 75 and flow rate controller 76 supplies the $N_2$ gas of the flow rate Q2 ($Q2<Q1$) to the nozzle 71.

Further, a temperature control mechanism 77 for adjusting the temperature of the $N_2$ gas is provided in the middle of the supply line 72. The temperature control mechanism 77 includes a heating mechanism for heating the $N_2$ gas. The temperature control mechanism 77 may suppress a temperature drop of the substrate W due to the supply of the $N_2$ gas.

The second liquid supply unit 8 supplies the second processing liquid to the second main surface Wb of the substrate W held by the holding unit 2. The second liquid supply unit 8 includes, for example, nozzles 81A and 81B for discharging the second processing liquid, and supply lines 82A and 82B for supplying the second processing liquid to the nozzles 81A and 81B.

The nozzles 81A and 81B are provided, for example, at the upper end of the fluid supply shaft 11 and include a discharge port for discharging the second processing liquid upward. The nozzles 81A and 81B are disposed near the center of the second main surface Wb so that a liquid film may be formed on the entire second main surface Wb of the rotating substrate W.

In the middle of the supply lines 82A and 82B, an on-off valve 85 for opening and closing the flow path of the second processing liquid, and a flow rate controller 86 for controlling the flow rate of the second processing liquid are provided. The on-off valve 85 and the flow rate controller 86 are provided for each type of the second processing liquid.

The second processing liquid is supplied to the second main surface Wb of the substrate W. The nozzle 81A discharges a second chemical liquid or a rinsing liquid as the second processing liquid. Meanwhile, the nozzle 81B discharges the rinsing liquid as the second processing liquid.

The type of the second processing liquid is not particularly limited. The number of nozzles is also not particularly limited. The plurality of types of second processing liquids may be discharged from one nozzle or other nozzles.

The control unit 9 controls the rotation mechanism 3, the first liquid supply unit 4, the gas supply unit 7, and the second liquid supply unit 8. The control unit 9 is, for example, a computer, and includes a central processing unit (CPU) 91 and a storage medium 92 such as a memory. The storage medium 92 stores programs that control various processes executed in the substrate processing apparatus 1. The control unit 9 controls the operation of the substrate processing apparatus 1 by causing the CPU 91 to execute the program stored in the storage medium 92.

Next, the substrate processing method of the present embodiment will be described with reference to FIG. 2. Each step illustrated in FIG. 2 is performed under the control of the control unit 9. In S101 to S106 of FIG. 2, the rotation mechanism 3 rotates the holding unit 2 and rotates the substrate W held by the holding unit 2.

Figure 3:
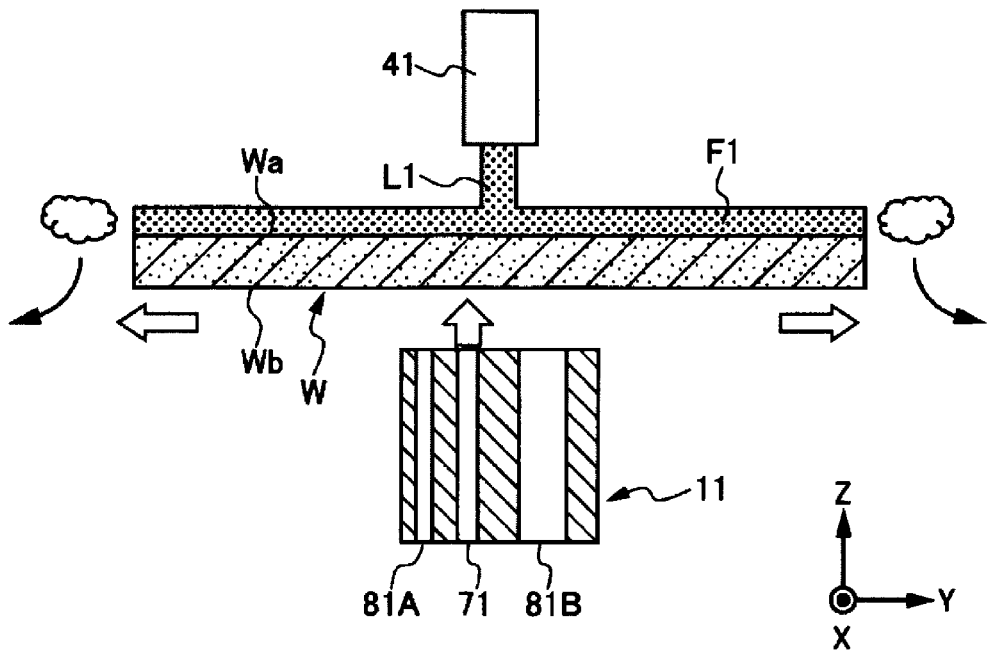
FIG. 3 is a diagram illustrating an example of S101 of FIG. 2.

In S101 of FIG. 2, as illustrated in FIG. 3, the nozzle 41 supplies the first chemical liquid L1 to be reused to the first main surface Wa of the substrate W. The first chemical liquid L1 is supplied to the central portion of the first main surface Wa, and is wetted and spread over the entire first main surface Wa by centrifugal force to form a liquid film F1. The first chemical liquid L1 is, for example, BHF. As described above, the first chemical liquid L1 to be reused is not limited to BHF.

Further, in S101, the nozzle 71 supplies $N_2$ gas to the second main surface Wb of the substrate W. The $N_2$ gas spreads along the second main surface Wb of the substrate W and suppresses the vapor of the first chemical liquid L1 from wrapping around the second main surface Wb. Therefore, it is possible to suppress the generation of particles on the second main surface Wb. Further, unlike the case where the rinsing liquid is supplied to the second main surface Wb, it is possible to prevent the first chemical liquid L1 from mixing with the rinsing liquid, thereby suppressing a change in the concentration of the first chemical liquid L1. Therefore, the change in the performance of the first chemical liquid L1 may be suppressed, and the first chemical liquid L1 may be reused.

The flow rate of the $N_2$ gas is set by an experiment to suppress the vapor of the first chemical liquid L1 from wrapping around the second main surface Wb. The flow rate Q1 of the $N_2$ gas in S101 is larger than the flow rate Q2 of the $N_2$ gas in the other steps such as S102 to S106. Q1 is, for example, 10 L/min to 60 L/min, and Q2 is, for example, 0.5 L/min to 2 L/min.

In S101, the control unit 9 prohibits the supply of the second processing liquid by the nozzles 81A and 81B to the second main surface Wb. Prohibiting the supply is different from the first chemical liquid L1 to be reused, and is, for example, the second chemical liquid and the rinsing liquid. Since the supply of the second chemical liquid and the rinsing liquid is prohibited, the change in the concentration of the first chemical liquid may be suppressed. When there is no second liquid supply unit 8, it is naturally unnecessary to prohibit the supply of the second processing liquid.

Further, in S101, the control unit 9 may measure the temperature of the liquid film F1 of the first chemical liquid L1 by the sensor 12 (see, e.g., FIG. 1), and adjust the temperature of the $N_2$ gas based on the measured temperature of the liquid film F1. The sensor 12 is, for example, an infrared sensor. By controlling the temperature of the $N_2$ gas, it is possible to suppress the temperature drop of the substrate W due to the supply of the $N_2$ gas.

Figure 4:
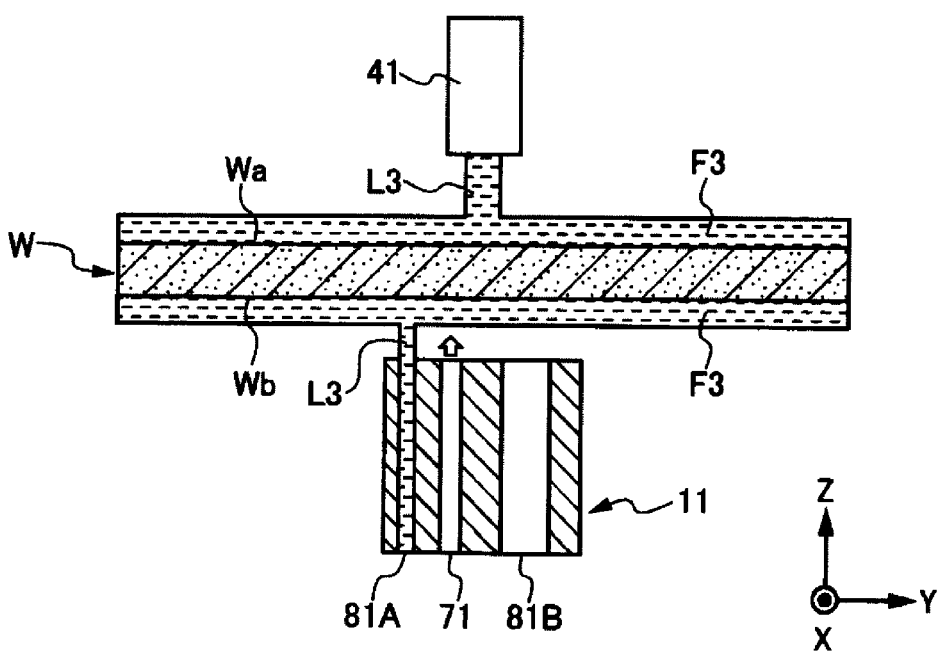
FIG. 4 is a diagram illustrating an example of S102 and S104 of FIG. 2.

Next, in S102 of FIG. 2, as illustrated in FIG. 4, the nozzle 41 supplies the rinsing liquid L3 to the first main surface Wa of the substrate W. The rinsing liquid L3 is supplied to the central portion of the first main surface Wa, is wetted and spread over the entire first main surface Wa by centrifugal force, replaces the first chemical liquid L1, and forms a liquid film F3 of the rinsing liquid L3. The rinsing liquid L3 is, for example, DIW.

In S102, the nozzle 81A supplies the rinsing liquid L3 to the second main surface Wb of the substrate W. The rinsing liquid L3 is supplied to the central portion of the second main surface Wb, and is wetted and spread over the entire second main surface Wb by centrifugal force to form the liquid film F3. The liquid film F3 is formed on both the first main surface Wa and the second main surface Wb at the same time.

Further, in S102, the nozzle 71 discharges $N_2$ gas so that the rinsing liquid L3 does not enter the nozzle 71. The flow rate of the $N_2$ gas is Q2. By reducing the flow rate of the $N_2$ gas from Q1 to Q2, it is possible to suppress the temperature drop of the substrate W due to the supply of the $N_2$ gas. Similarly to S102, also in S103 to S106 (to be described later), the nozzle 71 discharges the $N_2$ gas so that various processing liquids do not enter the nozzle 71.

Figure 5:
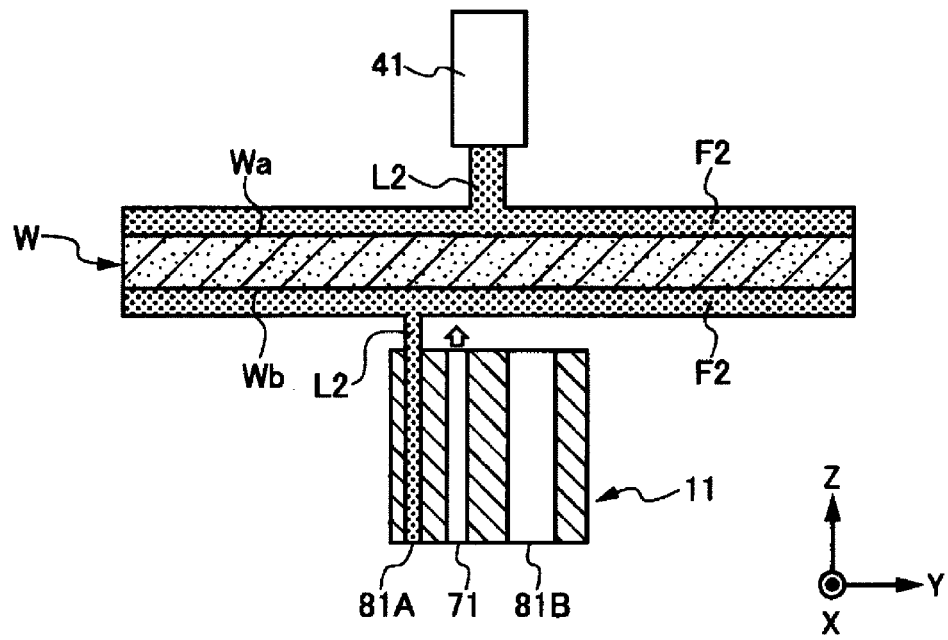
FIG. 5 is a diagram illustrating an example of S103 of FIG. 2.

Next, in S103 of FIG. 2, as illustrated in FIG. 5, the nozzle 41 supplies the second chemical liquid L2 to the first main surface Wa of the substrate W. The second chemical liquid L2 is supplied to the central portion of the first main surface Wa, is wetted and spread over the entire first main surface Wa by centrifugal force, replaces the rinsing liquid L3, and forms the liquid film F2 of the second chemical liquid L2. The second chemical liquid L2 is, for example, SC1.

Further, in S103, the nozzle 81A supplies the second chemical liquid L2 to the second main surface Wb of the substrate W. The second chemical liquid L2 is supplied to the central portion of the second main surface Wb, is wetted and spread over the entire second main surface Wb by centrifugal force, replaces the rinsing liquid L3, and forms the liquid film F2 of the second chemical liquid L2. The liquid film F2 is formed on both the first main surface Wa and the second main surface Wb at the same time.

Next, in S104 of FIG. 2, as illustrated in FIG. 4, the nozzle 41 supplies the rinsing liquid L3 to the first main surface Wa of the substrate W, and the nozzle 81A supplies the rinsing liquid L3 to the second main surface Wb of the substrate W. The liquid film F3 of the rinsing liquid L3 is formed on both the first main surface Wa and the second main surface Wb at the same time.

Figure 6:
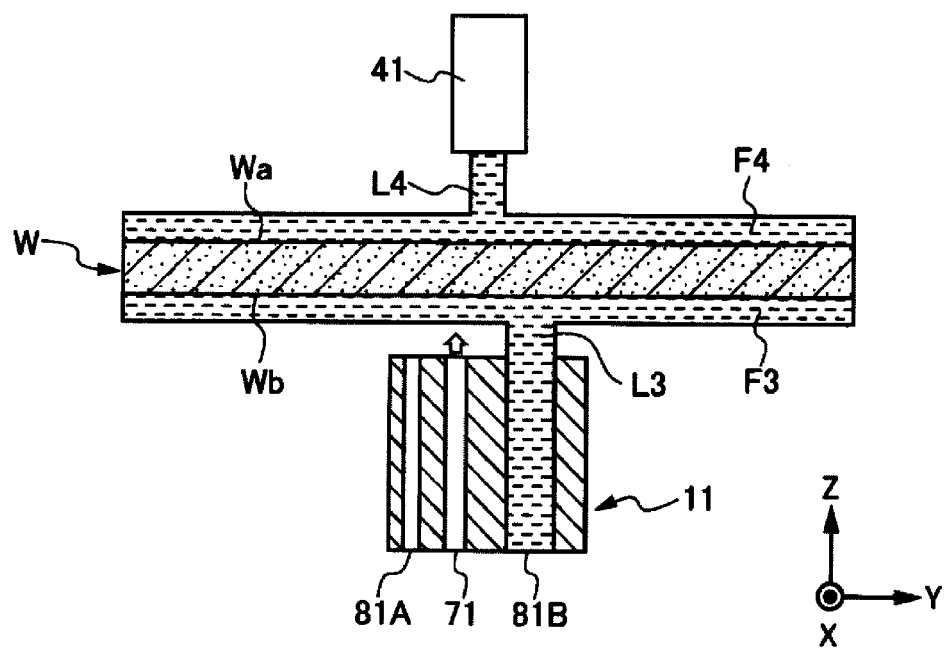
FIG. 6 is a diagram illustrating an example of S105 of FIG. 2.

Next, in S105 of FIG. 2, as illustrated in FIG. 6, the nozzle 41 supplies the drying liquid L4 to the first main surface Wa of the substrate W. The drying liquid L4 is supplied to the central portion of the first main surface Wa, is wetted and spread over the entire first main surface Wa by centrifugal force, replaces the rinsing liquid L3, and forms a liquid film F4 of the drying liquid L4. The drying liquid L4 is, for example, IPA.

Further, in S105, the nozzle 81B supplies the rinsing liquid L3 to the second main surface Wb of the substrate W. The rinsing liquid L3 is supplied to the central portion of the second main surface Wb, and is wetted and spread over the entire second main surface Wb by centrifugal force to form a liquid film F3. The liquid film F3 of the rinsing liquid L3 is formed on the second main surface Wb, and the liquid film F4 of the drying liquid L4 is formed on the first main surface Wa.

Figure 7:
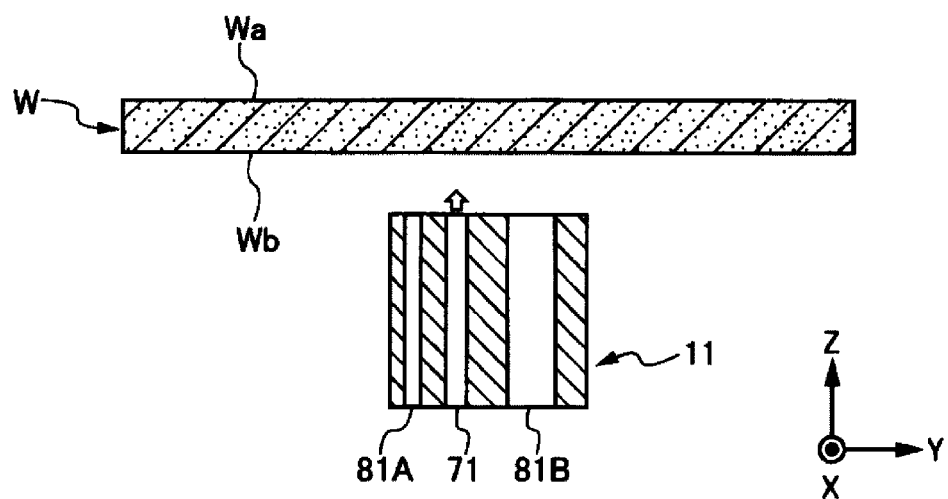
FIG. 7 is a diagram illustrating an example of S106 of FIG. 2.

Next, in S106 of FIG. 2, as illustrated in FIG. 7, the rotation mechanism 3 rotates the substrate W, and shakes off the drying liquid L4 remaining on the first main surface Wa of the substrate W and the rinsing liquid L3 remaining on the second main surface Wb of the substrate W from the substrate W. As a result, the substrate W is dried.

In S106, as described above, the supply position of the drying liquid L4 may be moved from the center of the first main surface Wa toward the peripheral edge. An opening is formed in the center of the liquid film F4 of the drying liquid L4, and the opening gradually expands from the central position to the peripheral position.

Figure 8:
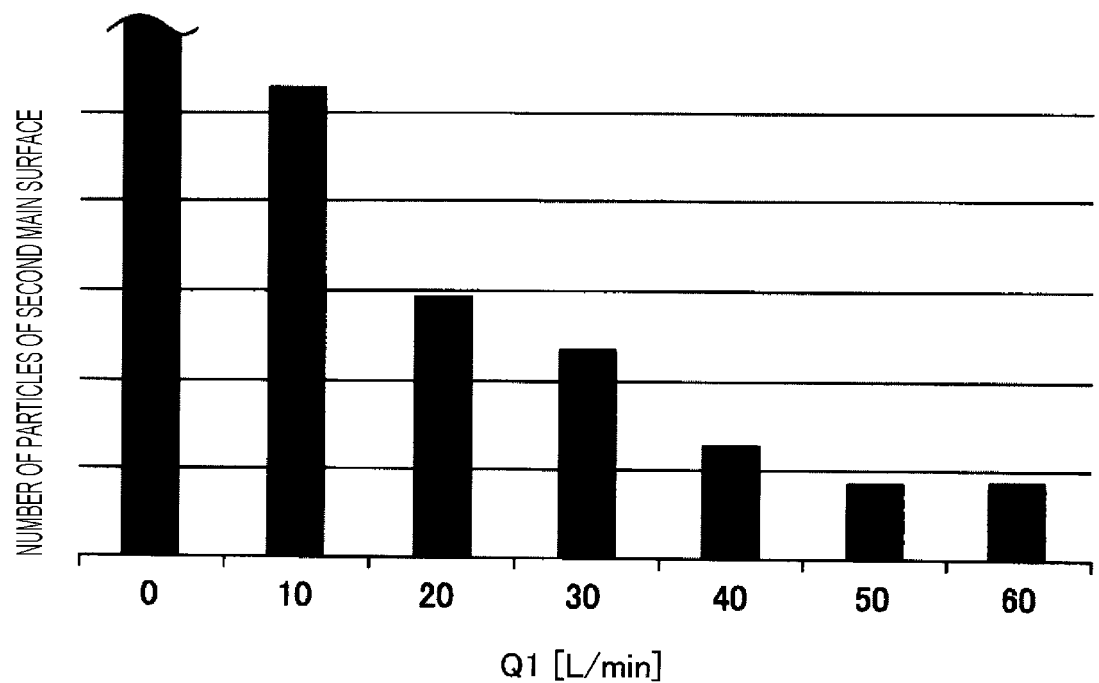
FIG. 8 is a diagram illustrating an example of a relationship between the flow rate of $N_2$ gas supplied to a second main surface and the number of particles on the second main surface.

Next, with reference to FIG. 8, descriptions will be made on a relationship between the flow rate Q1 of the $N_2$ gas supplied to the second main surface and the number of particles generated on the second main surface. In the experiment of FIG. 8, S101, S104, S105, and S106 illustrated in FIG. 2 were performed. S102 and S103 illustrated in FIG. 2 were not performed.

The experimental conditions in FIG. 8 were as follows. Q1 was 0 L/min, 10 L/min, 20 L/min, 30 L/min, 40 L/min, 50 L/min, or 60 L/min. Meanwhile, Q2 was 2 L/min. The first chemical liquid was BHF, the temperature of BHF was 20° C., the flow rate of BHF was 1.0 L/min, and the supply time of BHF was 25 seconds. The rinsing liquid was DIW, the temperature of DIW was 20° C., the flow rate of DIW was 1.5 L/min, and the supply time of DIW was 30 seconds. The drying liquid was IPA.

The experimental conditions in FIG. 8 were as follows. When Q1 was 10 L/min, the number of particles generated on the second main surface Wb was reduced to about ½₀ as compared with the case where Q1 was 0 L/min. Further, as Q1 became larger, the number of particles became smaller. However, when Q1 exceeded 50 L/min, almost no decrease in the number of particles was observed. Q1 may be 50 L/min or less in order to suppress wasteful consumption of $N_2$ gas.

Figure 9:
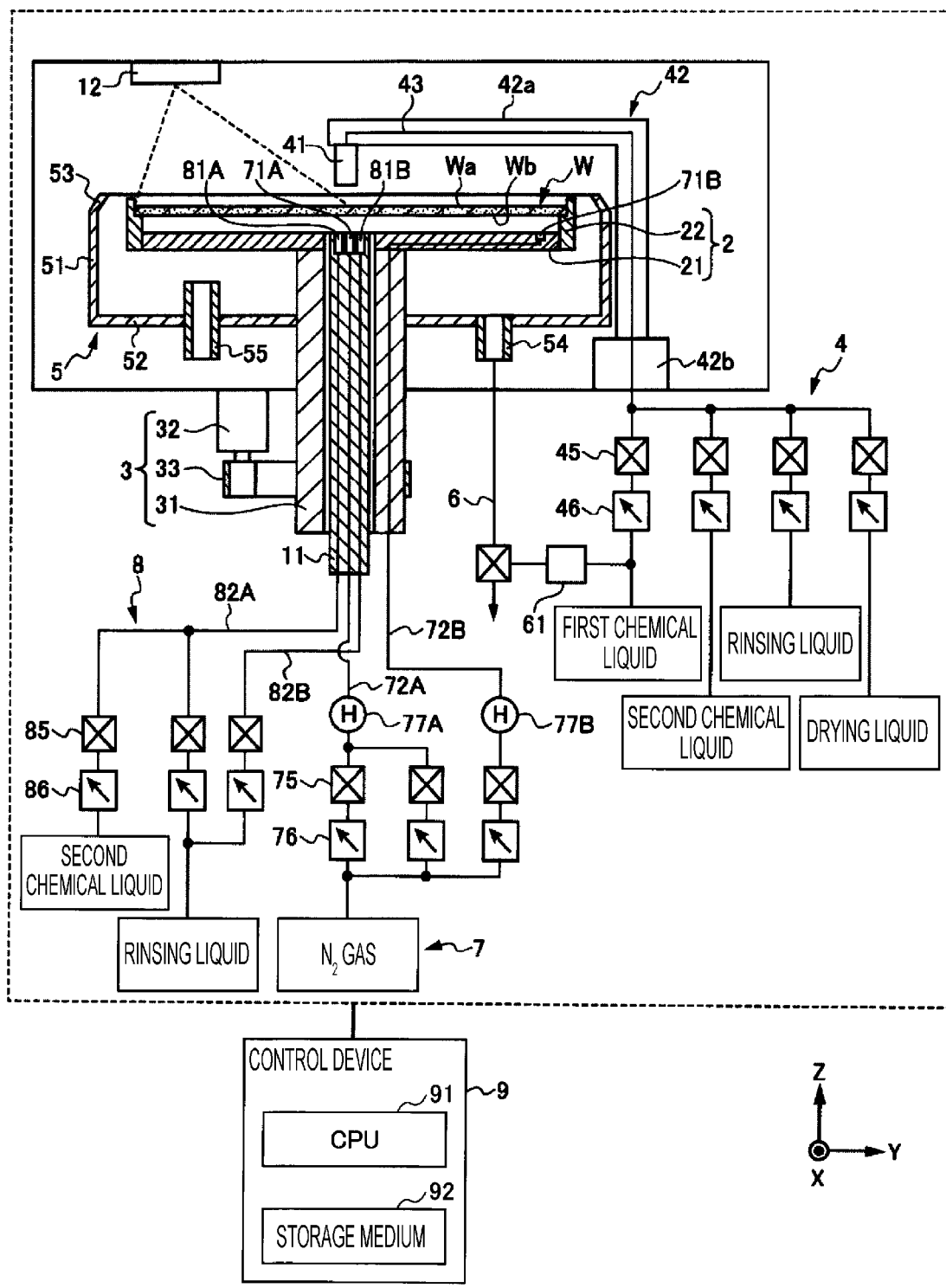
FIG. 9 is a diagram illustrating a substrate processing apparatus according to a modification.

Next, with reference to FIG. 9, the substrate processing apparatus 1 according to a modification will be described. Hereinafter, the differences between the substrate processing apparatus 1 of the modification and the substrate processing apparatus 1 of the above-described embodiment will be mainly described. The gas supply unit 7 of the modification includes a plurality of nozzles 71A and 71B, a plurality of supply lines 72A and 72B, and a plurality of temperature control mechanisms 77A and 77B.

The nozzle 71A includes a discharge port for discharging $N_2$ gas toward the central portion of the second main surface Wb of the substrate W, similarly to the nozzle 71 of the above-described embodiment. The central portion refers to, for example, a portion within 50 mm from the center. The nozzle 71A is provided, for example, at the upper end of the fluid supply shaft 11, and discharges $N_2$ gas perpendicularly or diagonally to the second main surface Wb.

Meanwhile, the nozzle 71B includes a discharge port for discharging $N_2$ gas toward the peripheral edge portion of the second main surface Wb of the substrate W. The peripheral edge portion refers to, for example, a portion within 50 mm from the peripheral edge. The nozzle 71B is provided on, for example, the base plate 21 of the holding unit 2 and rotates together with the holding unit 2. The nozzle 71B discharges $N_2$ gas perpendicularly or diagonally to the second main surface Wb.

Since the nozzle 71B forms a flow of $N_2$ gas on the peripheral edge portion of the second main surface Wb of the substrate W, it is possible to further suppress the vapor of the first chemical liquid L1 from wrapping around the second main surface Wb. Therefore, it is possible to further suppress the generation of particles on the second main surface Wb.

In S101 of FIG. 2, the control unit 9 may measure the temperature of the liquid film F1 of the first chemical liquid L1 at a plurality of points by the sensor 12, and when the range (the range of the maximum value and the minimum value) of the measured temperature of the liquid film F1 is equal to or more than a threshold value, the control unit 9 may adjust the temperature of the $N_2$ gas by the temperature control mechanisms 77A and 77B so that the temperature range is less than the threshold value. By adjusting the temperature of the $N_2$ gas, the temperature unevenness of the liquid film F1 may be reduced, and the processing unevenness of the substrate W may be suppressed. When the measured temperature range of the liquid film F1 is equal to or more than the threshold value, the control unit 9 changes the temperature of the $N_2$ gas by at least one of the temperature control mechanisms 77A and 77B. Meanwhile, when the measured temperature range of the liquid film F1 is less than the threshold value, the control unit 9 does not have to change the temperature of the $N_2$ gas by the temperature control mechanisms 77A and 77B.

Figure 10:
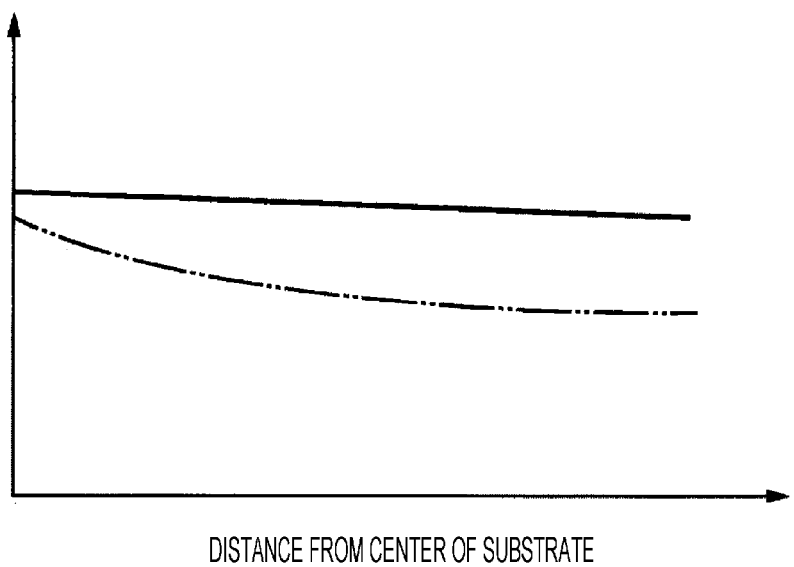
FIG. 10 is a diagram illustrating an example of the temperature distribution of a liquid film formed on a first main surface of a substrate.

When the temperature of the $N_2$ gas is not adjusted, the temperature of the liquid film F1 becomes lower from the center of the substrate W toward the peripheral edge as indicated by the alternate long and short dash line in FIG. 10. Therefore, the control unit 9 measures the temperature of the liquid film F1 at a plurality of points in the radial direction of the substrate W, and when the measured temperature width of the liquid film F1 is equal to or more than the threshold value, the control unit 9 controls the temperature of the $N_2$ gas discharged from the nozzle 71B to be higher than the temperature of the $N_2$ gas discharged from the nozzle 71A. As a result, as indicated by the solid line in FIG. 10, the temperature unevenness of the liquid film F1 may be suppressed. Further, when the measured temperature width of the liquid film F1 is less than the threshold value, the control unit 9 may control the temperature of the $N_2$ gas discharged from the nozzle 71B to be the same as the temperature of the $N_2$ gas discharged from the nozzle 71A.

The plurality of temperature control mechanisms 77A and 77B independently adjust the temperature of the $N_2$ gas discharged from the plurality of nozzles 71A and 71B. It is easy to adjust the temperature distribution of the liquid film F1. However, even when the number of the temperature control mechanisms 77 is one, it is possible to raise the temperature of the $N_2$ gas discharged from the nozzle 71B to be higher than the temperature of the $N_2$ gas discharged from the nozzle 71A. For example, when the temperature control mechanism 77B heats the $N_2$ gas discharged from the nozzle 71B, the other temperature control mechanism 77A may be omitted.

Figure 11:
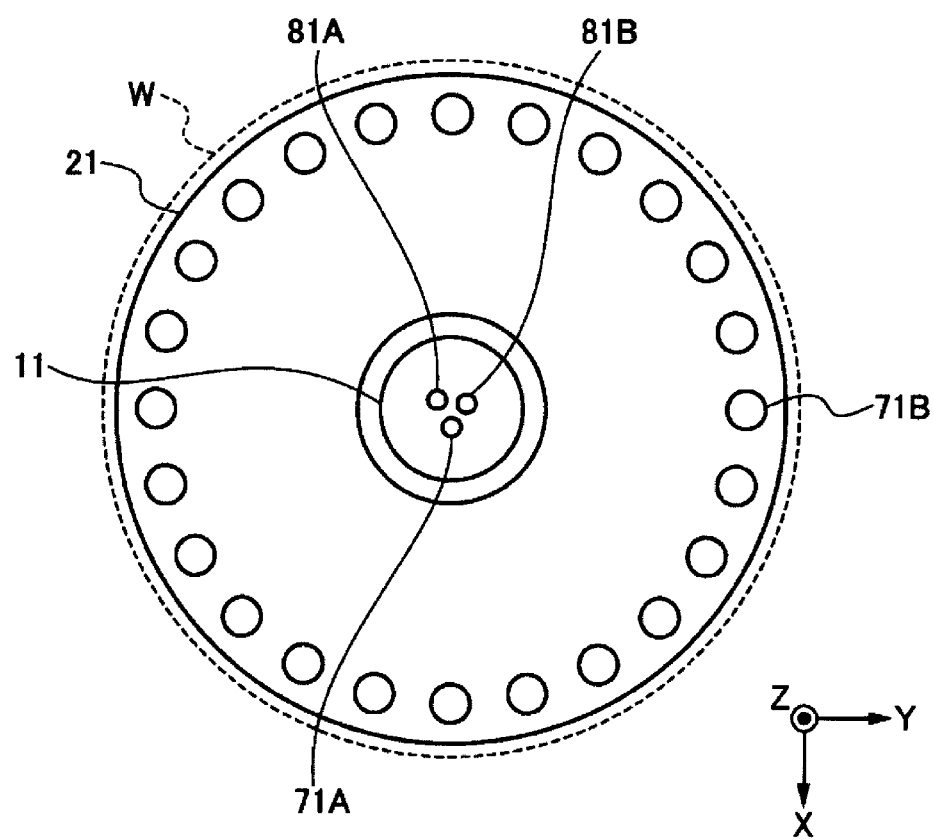
FIG. 11 is a diagram illustrating a first example of a nozzle of a gas supply unit.

Next, the arrangement of the nozzles 71B will be described with reference to FIG. 11. A plurality of nozzles 71B is arranged, for example, in a dot shape along the peripheral edge of the substrate W held by the holding unit 2. The dot-shaped nozzle 71B has a circular discharge port. A flow of $N_2$ gas may be formed at the peripheral edge portion of the second main surface Wb over the entire circumferential direction of the substrate W.

Figure 12:
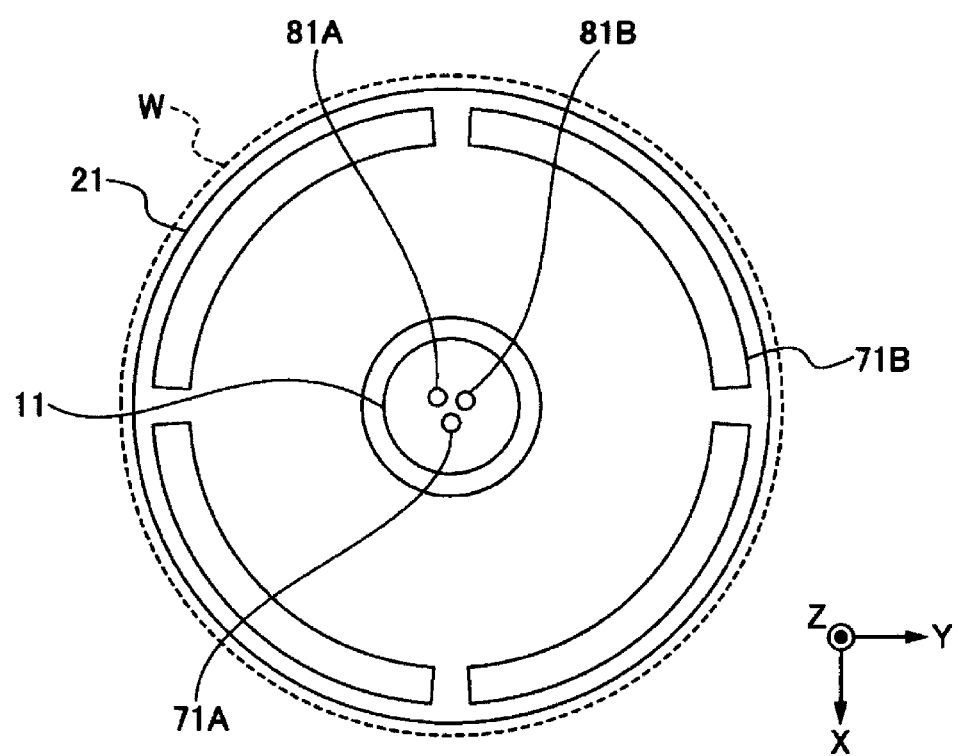
FIG. 12 is a diagram illustrating a second example of a nozzle of a gas supply unit.

As illustrated in FIG. 12, a plurality of nozzles 71B may be arranged, for example, in an arc shape along the peripheral edge of the substrate W held by the holding unit 2. The arc-shaped nozzle 71B has an arc-shaped discharge port.

Figure 13:
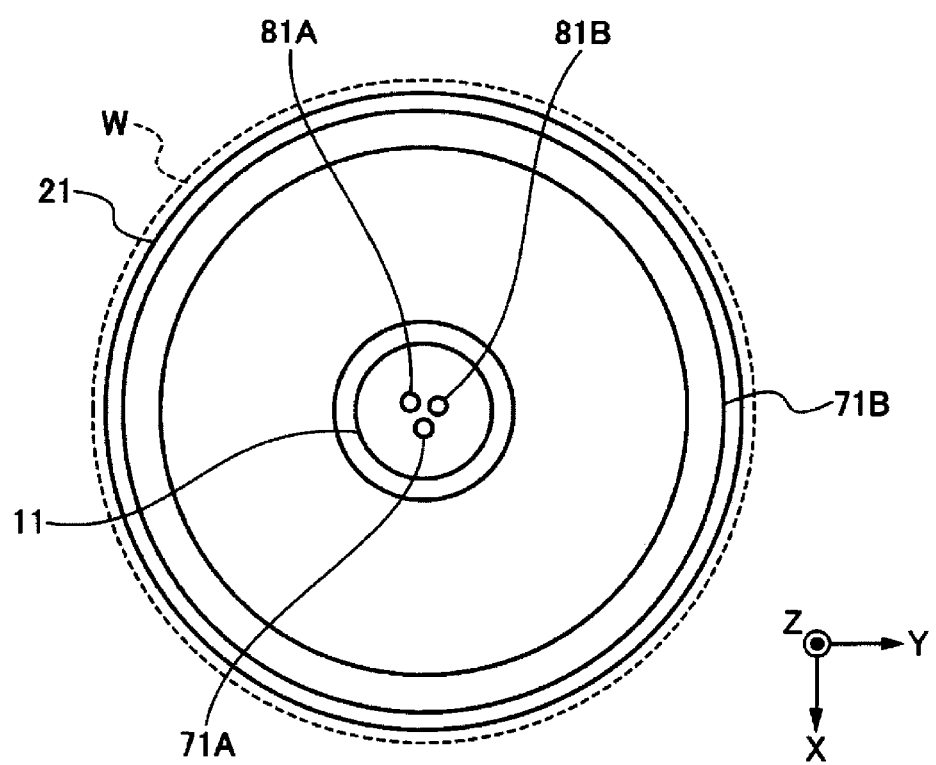
FIG. 13 is a diagram illustrating a third example of a nozzle of a gas supply unit.

Further, as illustrated in FIG. 13, the nozzles 71B may be arranged, for example, in an annular shape along the peripheral edge of the substrate W held by the holding unit 2. The annular nozzle 71B has an annular discharge port.

Figure 14:
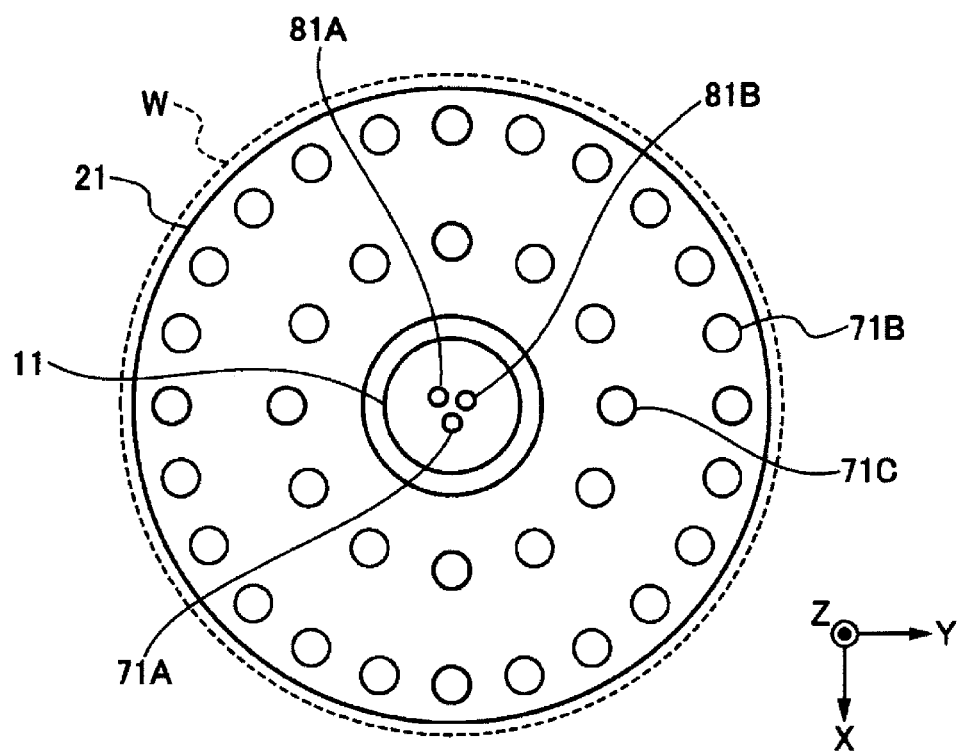
FIG. 14 is a diagram illustrating a fourth example of a nozzle of a gas supply unit.

As illustrated in FIG. 14, a nozzle 71C may be provided in addition to the nozzles 71A and 71B. The nozzle 71C is disposed between the nozzle 71A and the nozzle 71B, and is disposed concentrically with the nozzle 71B.

Figure 15:
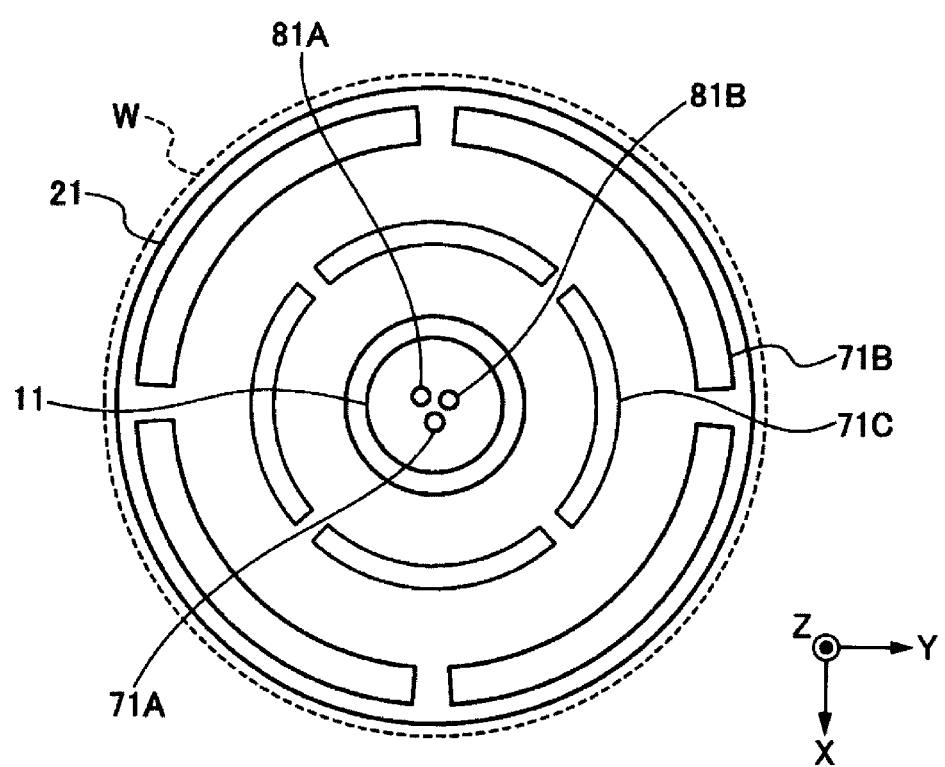
FIG. 15 is a diagram illustrating a fifth example of a nozzle of a gas supply unit.

A plurality of nozzles 71C may be disposed in a dot shape as illustrated in FIG. 14 in the circumferential direction of the substrate W held by the holding unit 2, may be disposed in an arc shape as illustrated in FIG. 15, or may be disposed in an annular shape (not illustrated). That is, the discharge port of the nozzle 71C may be circular, arcuate, or annular.

Next, the arrangement of the nozzles 71B will be described with reference to FIGS. 16 and 17. As illustrated in FIG. 17, the nozzle 71B is projected from the upper surface of the base plate 21 of the holding unit 2, is parallel to the second main surface Wb of the substrate W held by the holding unit 2, and discharges $N_2$ gas outward in the radial direction of the substrate W. It is possible to further suppress the vapor of the first chemical liquid L1 from wrapping around the second main surface Wb.

Figure 16:
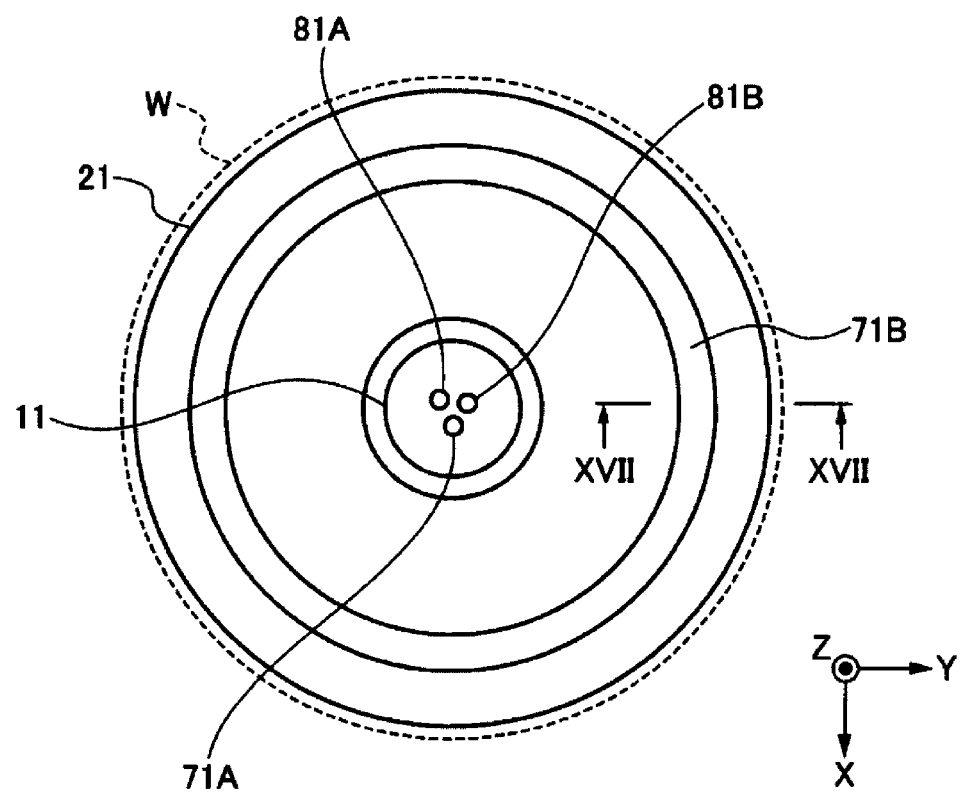
FIG. 16 is a diagram illustrating a sixth example of a nozzle of a gas supply unit.
Figure 17:
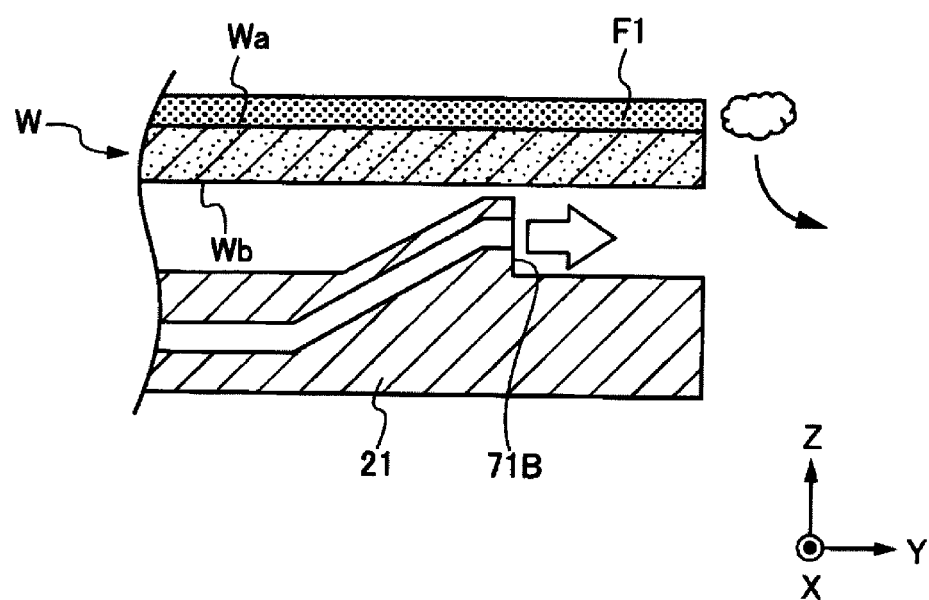
FIG. 17 is a cross-sectional view taken along line XVII-XVII of FIG. 16.

The nozzles 71B may be disposed in an annular shape as illustrated in FIG. 16, but may be disposed in a plurality of arcs shape, or may be disposed in a plurality of dots shape. That is, the discharge port of the nozzle 71B may be circular, arcuate, or annular.

Further, the nozzle 71B may be projected on the upper surface of the base plate 21 of the holding unit 2 as illustrated in FIG. 16, but may be projected on the upper surface of the fluid supply shaft 11. In the former case, the nozzle 71B rotates together with the base plate 21. Meanwhile, in the latter case, the nozzle 71B does not rotate together with the base plate 21.

Although the embodiments of the substrate processing apparatus and the substrate processing method according to the present disclosure have been described above, the present disclosure is not limited to the above-described embodiments. Various changes, modifications, replacements, additions, deletions, and combinations are possible within the scope of the claims. Surely, such changes and the like also belong to the technical scope of the present disclosure.

The present application claims priority based on Japanese Patent Application No. 2020-029483 filed with the Japan Patent Office on Feb. 25, 2020, and the entire contents of Japanese Patent Application No. 2020-029483 are incorporated into this application.

DESCRIPTION OF SYMBOLS

1: substrate processing apparatus
2: holding unit
4: first liquid supply unit (liquid supply unit)
5: collection unit
6: circulation path
7: gas supply unit
9: control unit
W: substrate
Wa: first main surface
Wb: second main surface

What is claimed is:

1. A substrate processing apparatus comprising:
a holder configured to hold a substrate, wherein the substrate comprises an upper face when held by the holder and a bottom face when held by the holder;
a liquid supply including a first nozzle and configured to supply a first processing liquid to the upper face of the substrate held by the holder using the first nozzle, wherein the first nozzle is positioned above the substrate while the substrate is held by the holder;
a collector configured to collect the first processing liquid after the first processing liquid has been supplied to the upper face of the substrate;
a circulation path configured to return the first processing liquid collected by the collector to the liquid supply;
a gas supply including a second nozzle configured to supply a gas to the bottom face of the substrate while the substrate is held by the holder, wherein the gas supply comprises a heater controller, and wherein the second nozzle is positioned below the held substrate;
a second liquid supply including a third nozzle positioned below the held substrate and configured to supply a second processing liquid to the bottom face of the held substrate;
a sensor configured to measure a temperature of a liquid film of the first processing liquid formed on the upper face of the held substrate; and
an apparatus controller configured to control the liquid supply, the gas supply, the second liquid supply, and the heater controller,
wherein the apparatus controller is configured to simultaneously supply the first processing liquid to the upper face of the held substrate and the gas to bottom face of the held substrate while prohibiting the third nozzle from supplying the second processing liquid and while not ejecting the first processing liquid onto any portion of the bottom face of the held substrate,
wherein the apparatus controller is configured to adjust the temperature of the gas based on the temperature of the liquid film measured by the sensor, and
wherein the apparatus controller is configured to have the third nozzle supply the second processing liquid to the bottom face of the held substrate after controlling the simultaneous supply of the first processing liquid and the gas.

2. The substrate processing apparatus according to claim 1, wherein the apparatus controller measures the temperature of the liquid film at a plurality of points by the sensor, and when a temperature range of the liquid film is equal to or larger than a threshold value, the apparatus controller adjusts the temperature of the gas by the heater controller, and supplies the gas at the adjusted temperature to the bottom face of the substrate.

3. The substrate processing apparatus according to claim 1, wherein the second nozzle is configured to discharge the gas toward a peripheral edge portion of the bottom face of the substrate held by the holder.

4. The substrate processing apparatus according to claim 3, wherein the second nozzle is disposed in an annular shape, wherein the second nozzle is one of a plurality of arc-shaped nozzles, or wherein the second nozzle is one of a plurality of nozzles along a peripheral edge of the substrate held by the holder.

5. The substrate processing apparatus according to claim 3, wherein the second nozzle discharges the gas perpendicularly or diagonally to the bottom face of the substrate held by the holder.

6. The substrate processing apparatus according to claim 3, wherein the second nozzle discharges the gas parallel to the bottom face of the held substrate and outward in a radial direction of the substrate.

7. A substrate processing method comprising:
providing a substrate processing apparatus including:
a holder configured to hold a substrate, wherein the substrate comprises an upper face when held by the holder and a bottom face when held by the holder;
a liquid supply including a first nozzle and configured to supply a first processing liquid to the upper face of the substrate held by the holder using the first nozzle, wherein the first nozzle is positioned above the substrate while the substrate is held by the holder;
a collector configured to collect the first processing liquid after the first processing liquid has been supplied to the upper face of the substrate;
a circulation path configured to return the first processing liquid collected by the collector to the liquid supply;

a gas supply including a second nozzle configured to supply a gas to the bottom face of the substrate while the substrate is held by the holder, wherein the gas supply comprises a heater controller, and wherein the second nozzle is positioned below the held substate;

a second liquid supply including a third nozzle positioned below the held substrate and configured to supply a second processing liquid to the bottom face of the held substrate;

a sensor configured to measure a temperature of a liquid film of the first processing liquid formed on the upper face of the held substrate; and an apparatus controller configured to control the liquid supply, the gas supply, the second liquid supply, and the heater controller, wherein the apparatus controller is configured to adjust the temperature of the gas based on the temperature of the liquid film measured by the sensor;

simultaneously supplying, by the apparatus controller, the first processing liquid to the upper face of the held substrate and the gas to the bottom face of the held substrate while prohibiting the third nozzle from supplying the second processing liquid and while not ejecting the first processing liquid onto any portion of the bottom face of the held substrate;

supplying, by the apparatus controller, the second processing liquid from the third nozzle to the bottom face of the held substate after the simultaneous supplying of the first processing liquid and the gas, collecting the first processing liquid using the collector; and reusing, by the apparatus controller, the collected first processing liquid for processing another substrate through the circulation path.

8. The substrate processing method according to claim 7, wherein the measuring of the temperature of the liquid film includes measuring the temperature of the liquid film at a plurality of points, and the temperature of the gas is adjusted when a temperature range of the liquid film is equal to or larger than a threshold value.

9. The substrate processing method according to claim 7, wherein the second nozzle is configured to discharge the gas toward a peripheral edge portion of the bottom face of the substrate held by the holder.

10. The substrate processing method according to claim 7, wherein the second nozzle is disposed in an annular shape, wherein the second nozzle is one of a plurality of arc-shaped nozzles, or wherein the second nozzle is one of a plurality of nozzles along a peripheral edge of the substrate held by the holder.

11. The substrate processing method according to claim 7, wherein the second nozzle discharges the gas perpendicularly or diagonally to the bottom face of the substrate held by the holder.

12. The substrate processing method according to claim 7, wherein the second nozzle discharges the gas parallel to the bottom face of the held substrate and outward in a radial direction of the substrate.

* * * * *